United States Patent
Robles et al.

(10) Patent No.: US 8,030,768 B2
(45) Date of Patent: Oct. 4, 2011

(54) SEMICONDUCTOR PACKAGE WITH UNDER BUMP METALLIZATION ALIGNED WITH OPEN VIAS

(75) Inventors: Roel Robles, Singapore (SG); Danny Retuta, Tustin, CA (US); Mary Annie Cheong, Singapore (SG); Hien Boon Tan, Singapore (SG); Anthony Yi Sheng Sun, Singapore (SG); Richard Gan, Singapore (SG)

(73) Assignee: United Test And Assembly Center Ltd., Singapore (SG)

( * ) Notice: Subject to any disclaimer, the term of this patent is extended or adjusted under 35 U.S.C. 154(b) by 200 days.

(21) Appl. No.: 12/108,563

(22) Filed: Apr. 24, 2008

(65) Prior Publication Data

US 2008/0284015 A1  Nov. 20, 2008

Related U.S. Application Data

(60) Provisional application No. 60/913,671, filed on Apr. 24, 2007.

(51) Int. Cl.
*H01L 23/488* (2006.01)
*H01L 21/56* (2006.01)

(52) U.S. Cl. ......... 257/737; 257/E23.023; 257/E21.502; 257/738; 257/778; 257/780; 257/781; 257/779; 257/772; 257/774; 257/668; 257/773; 257/684; 257/796

(58) Field of Classification Search .......... 257/737, 257/738.778, 780, 781, 779, 772, 774, 668, 257/773, E23.023, E21.502, 684, 796
See application file for complete search history.

(56) References Cited

U.S. PATENT DOCUMENTS

| | | | | |
|---|---|---|---|---|
| 5,219,794 | A * | 6/1993 | Satoh et al. | 228/121 |
| 5,723,904 | A * | 3/1998 | Shiga | 257/698 |
| 6,137,185 | A * | 10/2000 | Ishino et al. | 257/786 |
| 6,229,209 | B1 * | 5/2001 | Nakamura et al. | 257/737 |
| 6,236,112 | B1 * | 5/2001 | Horiuchi et al. | 257/734 |
| 6,256,207 | B1 * | 7/2001 | Horiuchi et al. | 361/760 |
| 6,653,575 | B2 * | 11/2003 | Armezzani et al. | 174/262 |
| 6,713,863 | B2 * | 3/2004 | Murayama et al. | 257/707 |
| 7,019,406 | B2 * | 3/2006 | Huang et al. | 257/778 |
| 7,071,569 | B2 * | 7/2006 | Ho et al. | 257/778 |
| 7,161,370 | B2 * | 1/2007 | Maruyama et al. | 324/762 |
| 7,335,592 | B2 * | 2/2008 | Kim et al. | 438/667 |
| 7,358,117 | B2 * | 4/2008 | Tan et al. | 438/109 |
| 7,364,946 | B2 * | 4/2008 | Karnezos | 438/109 |
| 7,375,032 | B2 * | 5/2008 | Seliger et al. | 438/695 |
| 7,381,587 | B2 * | 6/2008 | Japp et al. | 438/107 |
| 7,422,978 | B2 * | 9/2008 | Lee | 438/629 |
| 7,449,363 | B2 * | 11/2008 | Hsu | 438/106 |
| 7,498,196 | B2 * | 3/2009 | Lee et al. | 438/108 |
| 7,566,834 | B2 * | 7/2009 | Shimoto et al. | 174/258 |
| 7,675,131 | B2 * | 3/2010 | Derderian | 257/432 |
| 7,750,467 | B2 * | 7/2010 | Pu et al. | 257/737 |
| 2001/0000927 | A1 * | 5/2001 | Rodenbeck et al. | 257/778 |
| 2001/0022404 | A1 * | 9/2001 | Yamamoto et al. | 257/783 |
| 2001/0042924 | A1 * | 11/2001 | Hasegawa et al. | 257/780 |
| 2002/0003299 | A1 * | 1/2002 | Nakamura et al. | 257/734 |
| 2002/0151164 | A1 * | 10/2002 | Jiang et al. | 438/613 |

(Continued)

*Primary Examiner* — A Williams
(74) *Attorney, Agent, or Firm* — Sughrue Mion, PLLC

(57) ABSTRACT

A semiconductor package with a semiconductor chip having under bump metallizations (UBMs) on a first surface and a substrate having open vias. The substrate is attached to the semiconductor chip with the UBMs in alignment with the open vias. An encapsulant surrounds the semiconductor chip and the substrate and a conductor fills the open vias to form external package connections.

19 Claims, 8 Drawing Sheets

U.S. PATENT DOCUMENTS

| | | | |
|---|---|---|---|
| 2004/0184219 A1* | 9/2004 | Otsuka et al. | 361/306.3 |
| 2005/0040525 A1* | 2/2005 | Chien | 257/734 |
| 2006/0151870 A1* | 7/2006 | Nishiyama et al. | 257/700 |
| 2007/0029670 A1* | 2/2007 | Shibayama et al. | 257/737 |
| 2007/0246837 A1* | 10/2007 | Dong | 257/778 |
| 2007/0278657 A1* | 12/2007 | Lee | 257/692 |
| 2008/0006947 A1* | 1/2008 | Akiba et al. | 257/778 |
| 2008/0150159 A1* | 6/2008 | Aberin et al. | 257/778 |
| 2008/0315424 A1* | 12/2008 | Lee et al. | 257/762 |
| 2009/0057896 A1* | 3/2009 | Su | 257/738 |
| 2009/0200662 A1* | 8/2009 | Ng et al. | 257/723 |
| 2010/0159647 A1* | 6/2010 | Ito et al. | 438/124 |
| 2010/0200970 A1* | 8/2010 | Zhang | 257/673 |

\* cited by examiner

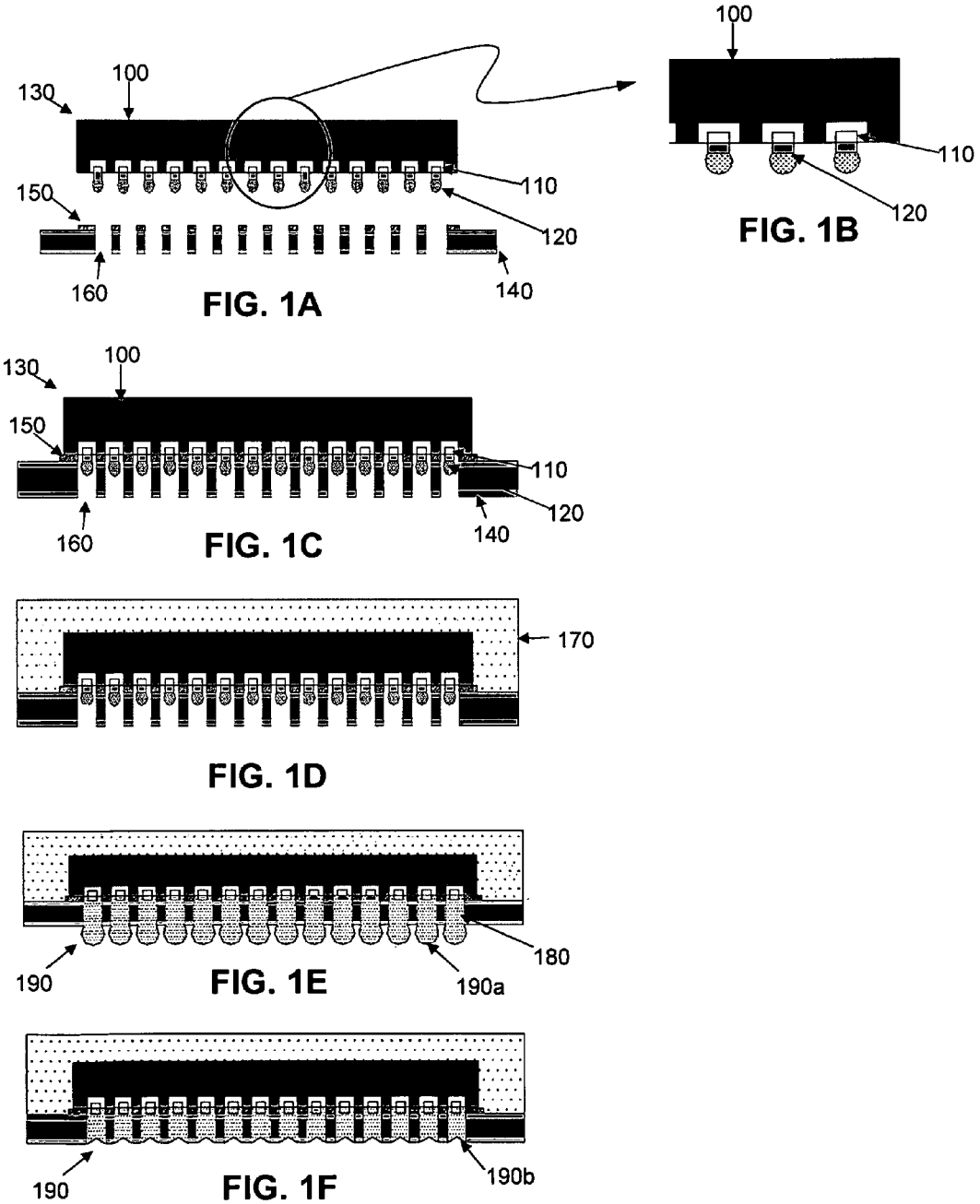

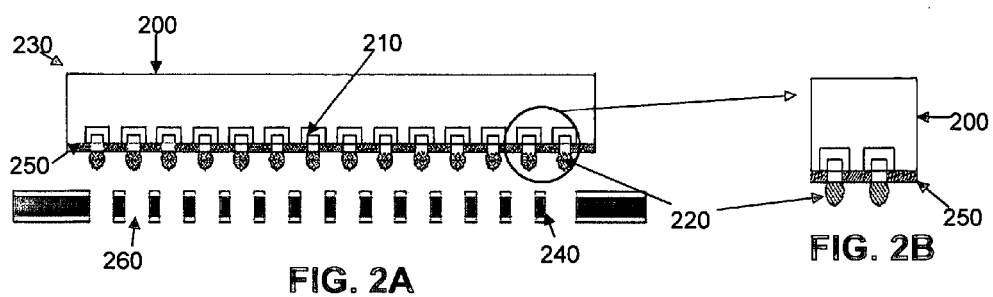
FIG. 2A
FIG. 2B
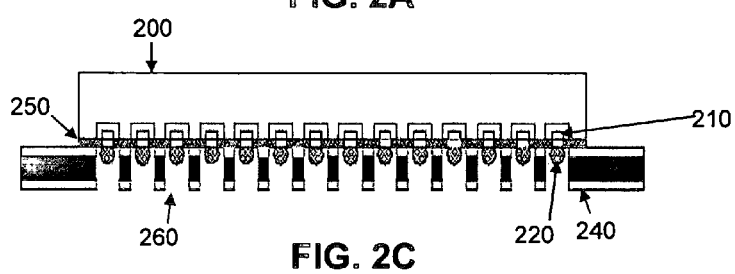
FIG. 2C
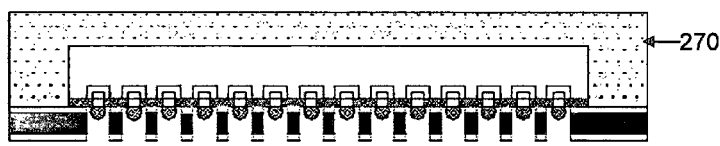
FIG. 2D
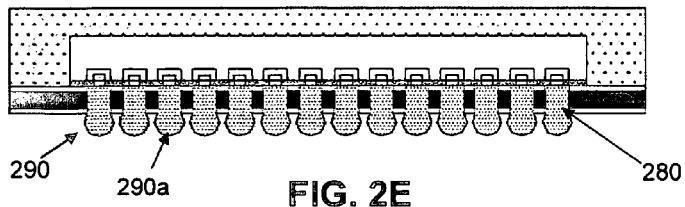
FIG. 2E
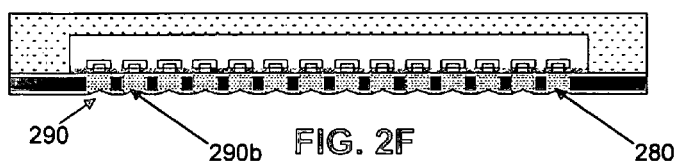
FIG. 2F

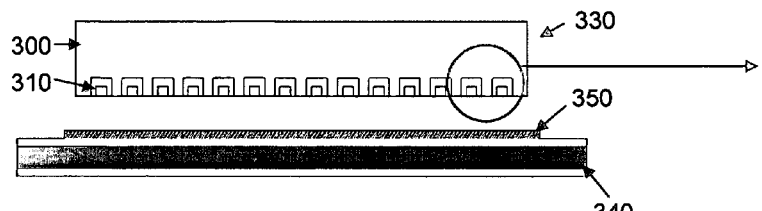
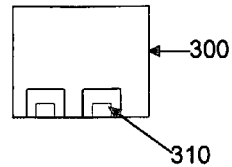
FIG. 3A
FIG. 3B
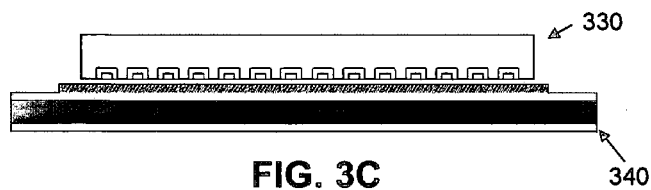
FIG. 3C
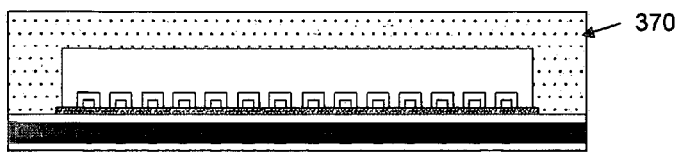
FIG. 3D
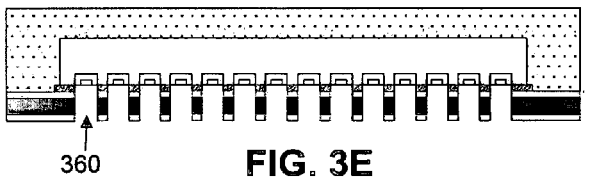
FIG. 3E
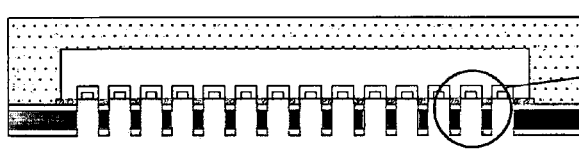
FIG. 3F
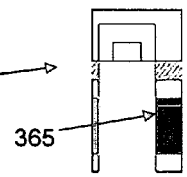
FIG. 3G
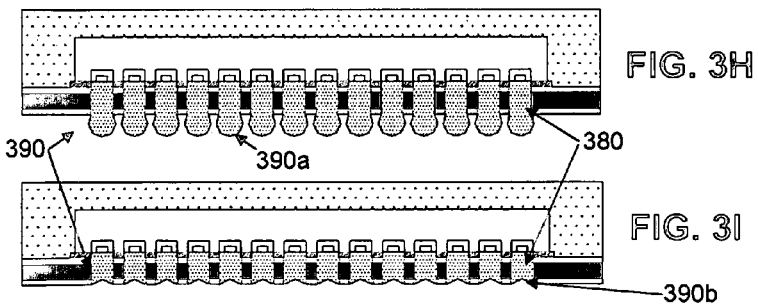
FIG. 3H
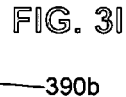
FIG. 3I

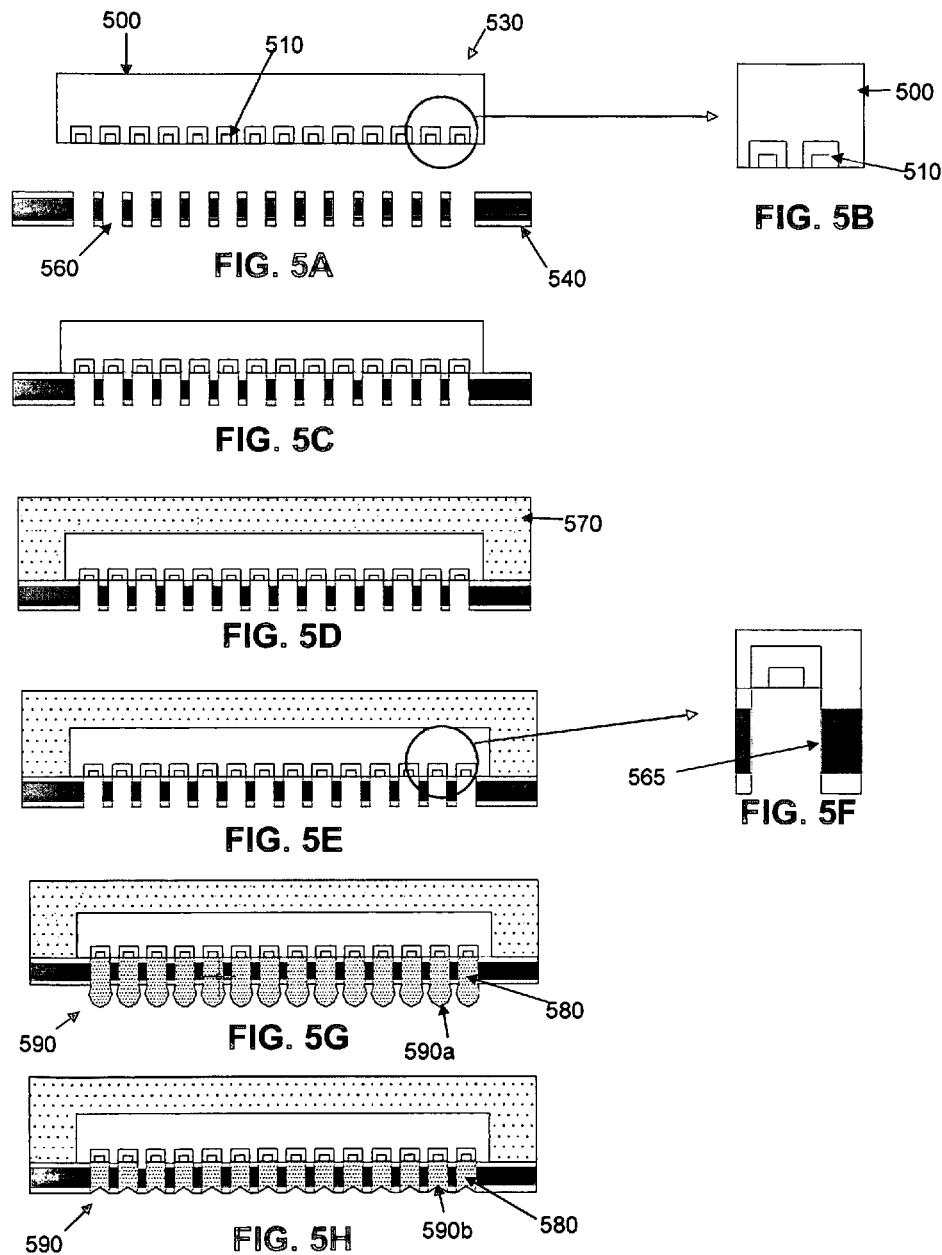

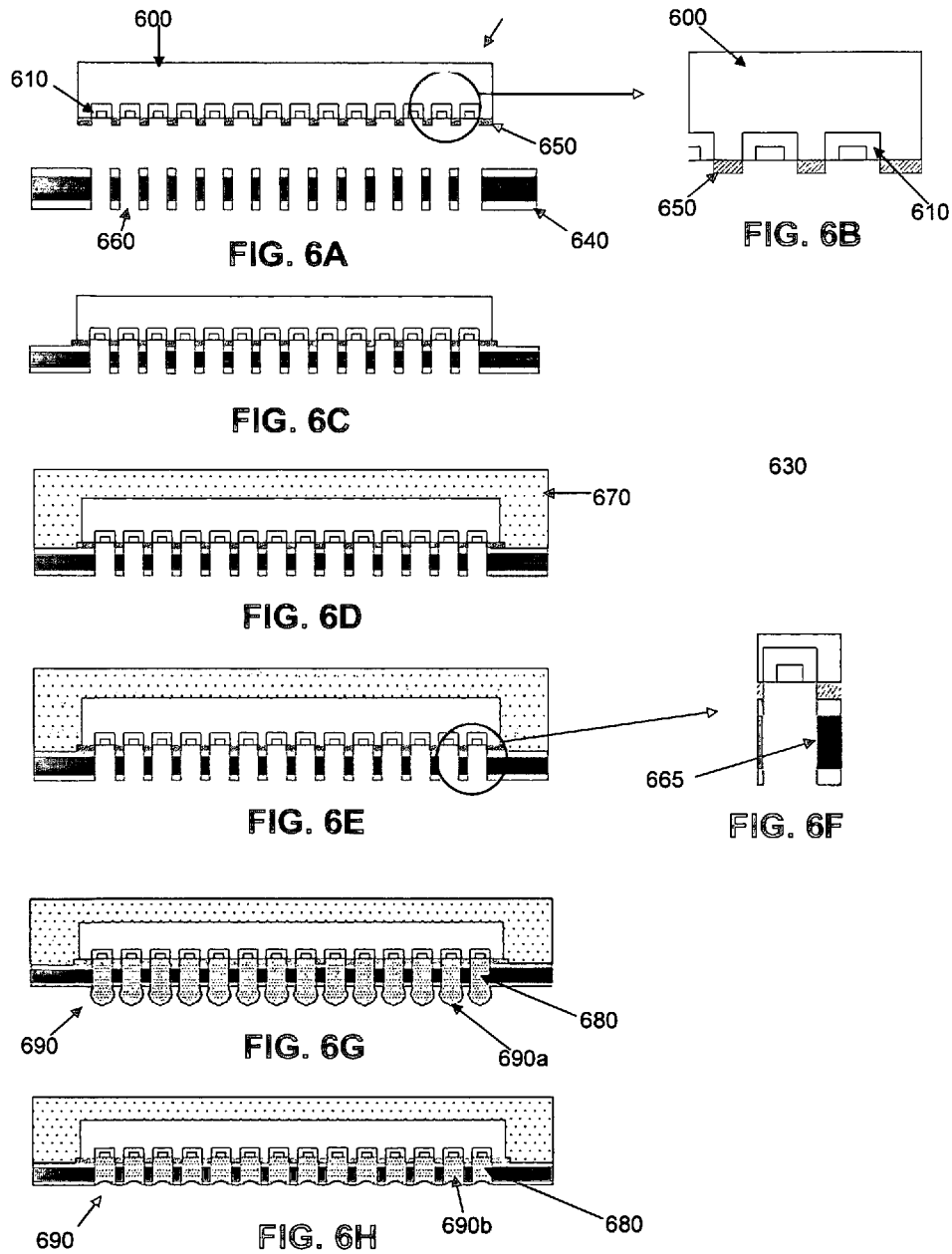

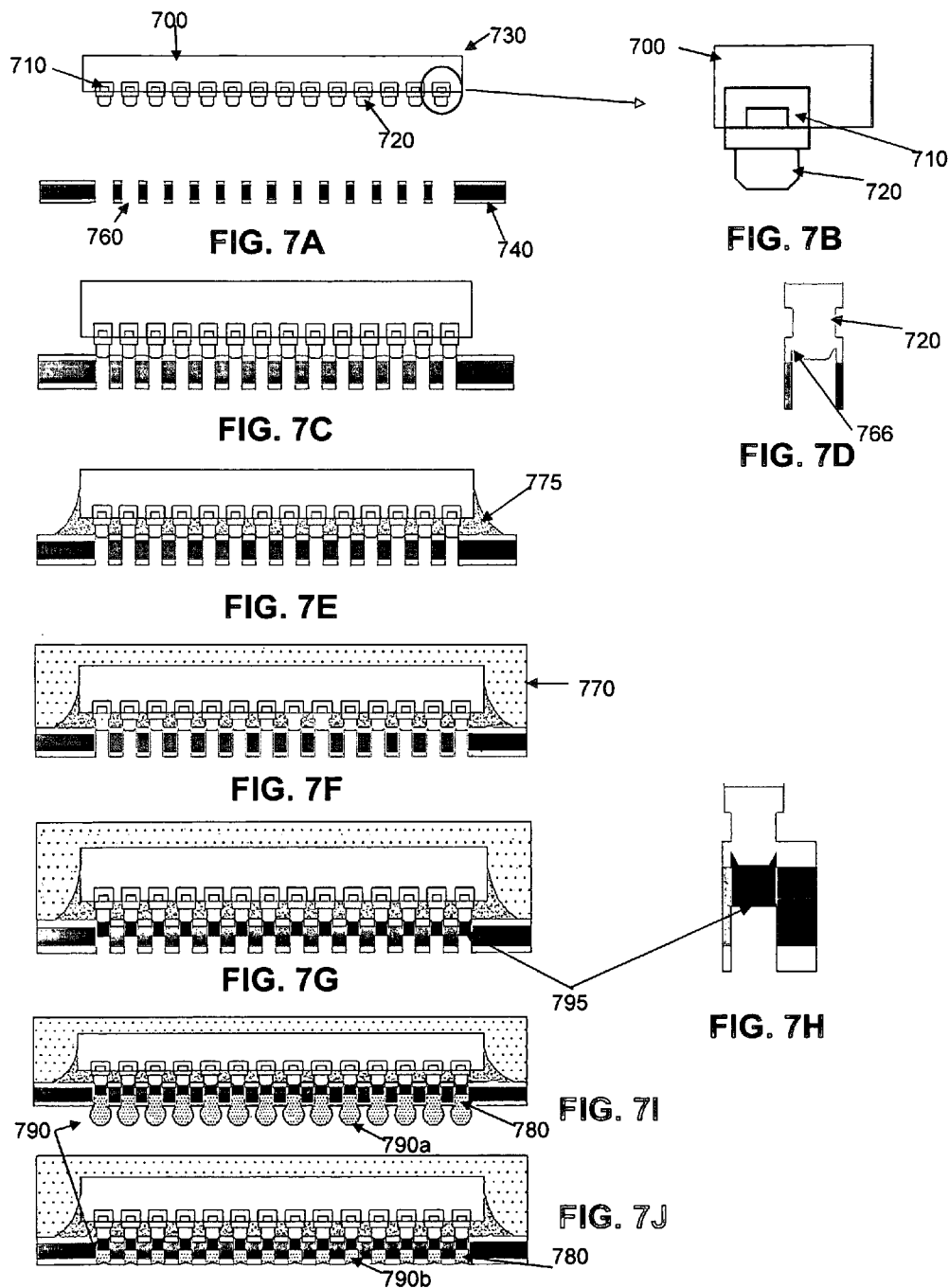

SEMICONDUCTOR PACKAGE WITH UNDER BUMP METALLIZATION ALIGNED WITH OPEN VIAS

CROSS-REFERENCE TO RELATED APPLICATIONS

This application claims priority from U.S. Provisional Application No. 60/913,671 filed on Apr. 24, 2007, the disclosure of which is incorporated herein by reference.

BACKGROUND OF INVENTION

1. Field of Invention

Apparatuses and methods consistent with the present invention relate to a semiconductor package with a semiconductor chip having under bump metallizations (UBMs) on a first surface and a substrate having open vias. The substrate is attached to the semiconductor chip with the UBMs in alignment with the open vias. An encapsulant surrounds the semiconductor chip and the substrate and a conductor fills the open vias to form external package connections.

2. Description of the Related Art

Conventional methods of forming a semiconductor package comprising a flip chip and a substrate involves mounting a chip 10 with solder bumps 12 onto a top surface of the substrate 14. When mounted, the solder bumps 12 of the chip 10 are in contact with the substrate 14 and gaps are formed between the chip 10 and the substrate 14 due to the solder bumps 12 present therebetween. The gaps between the chip 10 and the substrate 14 would typically be underfilled with an underfill resin 16 to encapsulate and to protect the solder bumps 12. The chip 10 and top surface of the substrate 14 are then encapsulated with a mold resin 18 to protect the chip 10. External package connections in the form of solder balls 20 are subsequently formed on a bottom surface of the substrate 14. An exemplary flip chip package is shown in FIG. 8 of the drawings. In the conventional package, the solder bumps 12 and solder balls 20 may be subjected to mechanical stress resulting from differential thermal expansions of the various components of the package under application of heat during thermal cycling or when the chip is in operation.

In U.S. Pat. No. 7,271,491, a carrier substrate with apertures is provided on a semiconductor device such that bond pads are aligned with apertures. Semiconductor device is a flip-chip device that has bond pads disposed over active surface. Walls of the apertures and the bond pads are coated with a conductive material. Solder material is provided at the opening of the apertures to result in the solder material filling the coated apertures by capillary action and forming solder bumps. However, in this method, there may be reliability issues resulting from inadequate contact between bond pad, the conductive coating and the solder material within the apertures.

In U.S. Pat. No. 6,022,761, a substrate is provided with apertures in which the openings on underside covered with conductive metal pads. An interposer with an array of conductive bumps is mounted onto the substrate such that the adhesive bumps resides in the apertures. A semiconductor device with an array of conductive bumps is pressed into contact with the interposer such that the conductive bumps are coupled to the conductive adhesive bumps to form the package as shown below. However, in this method, the conductive bumps and active circuitry of the semiconductor device while being pressed into contact with the interposer. Also, there may be reliability issues resulting from voids formed within the apertures should the adhesive bumps not fill the apertures adequately. Another problem may also be that the adhesive bumps may not adequately contact the metal pads to form a reliable electrical connection.

In U.S. Patent Application No. 2006/0057833, a substrate is provided with screen mask such that the wire ball bumps on the substrate fits into the apertures of the screen mask. Solder paste is spread over the mask to embed the wire ball bumps. The screen mask is then removed and the solder paste reflowed to form solder ball connections. However, this method is focused on forming external package connections in the form of solder balls rather than forming an improved electrical interconnect between the flip chip and the external package connections.

There is therefore a need to provide apparatuses and methods that can prevent or at least ameliorate one or more of the disadvantages of the prior art. One objective of the present invention is to reduce the stress on the bumps of flip chip. Another objective is to eliminate underfilling, which results in a saving of material costs.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

In a first aspect, there is provided a method of forming a semiconductor package having external package connections. The method includes: providing a semiconductor chip having under bump metallizations (UBMs) on a first surface; attaching the first surface of the semiconductor chip to a substrate, the UBMs of the semiconductor chip being in alignment with open vias formed in the substrate; encapsulating the semiconductor chip and the substrate; and filling with open vias with a conductor to form the external package connections.

The conductor that fills the open vias may protrude outside the open vias to form external package connections in the form of conductive bumps. The semiconductor chip may be attached to the substrate by thermo-compression or by an adhesive applied on at least one of the first surface of the chip or the substrate. The adhesive can be a B-stage adhesive or solder mask.

The semiconductor chip may have conductive protrusions extending below the UBMs. The conductive protrusions can be solder bumps, metallic pillars with a solder cap or metallic stud bumps.

The walls of the open vias may be plated with a conductive metallic material. The metallic material may be gold. The open vias of the substrate may be formed after the semiconductor chip is attached to the substrate. The filling of the vias with the conductor can be achieved by ball dropping or paste printing.

In a second aspect, there is provided a semiconductor package including: a semiconductor chip having under bump metallizations (UBMs) on a first surface; substrate having open vias, the substrate being attached to the semiconductor chip and the UBMs being in alignment with the open vias; an encapsulant surrounding the semiconductor chip and the substrate; and a conductor which fills the open vias to form external package connections.

The conductor may protrude outside the open vias to form external package connections in the form of conductive bumps. The semiconductor package may further comprise an adhesive between the first surface of the chip and the substrate.

The semiconductor chip may have conductive protrusions extending below the UBMs. The conductive protrusions may be solder bumps, metallic pillars with a solder cap, or metallic stud bumps.

The walls of the open vias may be plated with a conductive metallic material. The conductive metallic material may be gold.

BRIEF DESCRIPTION OF THE DRAWINGS

The above and/or other aspects of the present invention will become apparent and more readily appreciated from the following description of the exemplary embodiments, taken in conjunction with the accompanying drawings, in which:

FIG. 1 illustrates an embodiment of the inventive package and a method of making the package.

FIG. 2 illustrates an embodiment of the inventive package and a method of making the package.

FIG. 3 illustrates an embodiment of the inventive package and a method of making the package.

FIG. 5 illustrates an embodiment of the inventive package and a method of making the package.

FIG. 6 illustrates an embodiment of the inventive package and a method of making the package.

FIG. 7 illustrates an embodiment of the inventive package and a method of making the package.

DETAILED DESCRIPTION OF EXEMPLARY EMBODIMENTS OF THE INVENTION

Figure 4A:
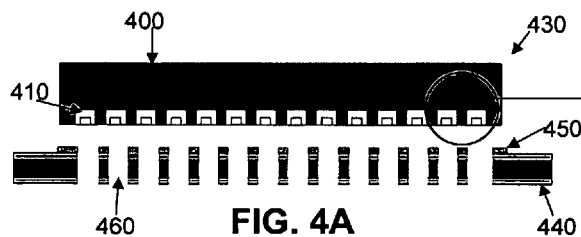
FIG. 4 illustrates an embodiment of the inventive package and a method of making the package.

Hereinafter, exemplary embodiments of the present invention will be described with reference to the accompanying drawings.

FIGS. 1A to 1F illustrate an embodiment of the inventive package and a method of making the package. FIG. 1A shows a semiconductor chip 100, with under bump metallizations (UBMs) 110. In this particular embodiment, conductive protrusions 120, such as solder bumps or copper pillars with solder caps, protrude below the UBMs 110. An enlargement of a portion of FIG. 1A is shown in FIG. 1B. The chip 100, the UBMs 110, and the conductive protrusions 120 form a flip chip 130.

As shown in FIG. 1A, substrate 140 has printed B-stage epoxy adhesive 150 on the top surface. Vias 160 are formed in the substrate 140 and are plated with a conductor (not shown), such as gold (Au). The vias 160 are kept open.

As shown in FIG. 1C, as the flip chip 130 is being attached, the UBMs are aligned over the open vias 160 and the chip 100 is attached to the substrate 140 through the adhesive 150 therebetween. Each of the conductive protrusions 120 are embedded within their respective open vias 160. The bonding of the chip 100 to the substrate 140 can, for example, be achieved by thermo-compression.

Next, as shown in FIG. 1D, the chip 100 and the substrate 140 are encapsulated by mold resin 170. The encapsulation can, for example, be achieved by transfer molding. Then, as shown in FIG. 1E, the vias 160 are filled with a conductor 180. The filling of the vias 160 can be such that the conductor 180 fills the vias 160 until it protrudes outside of the vias 160 to form external package connections 190 in the form of solder balls 190a. In this particular embodiment, the conductor 180 is solder. Ball drop or solder paste printing can be used to fill the vias 160 with the conductor 180. Alternatively, the external package connections 190 or solder balls 190a, can be formed in a separate step after the vias 160 have been filled.

An alternate land grid array (LGA) package is shown in FIG. 1F, in which the external package connections 190 do not protrude out of the vias 160. The exposed end of the vias 160 form external package connections 190 in the form of a land grid array 190b.

FIGS. 2A to 2F illustrate a second embodiment of the inventive package and a method of making the package. FIG. 2A shows a semiconductor chip 200 with UBMs 210. In this particular embodiment, conductive protrusions 220, such as solder bumps or copper pillars with solder caps, protrude below the UBMs 210. The chip 200, the UBMs 210, and the conductive protrusions 220 form a flip chip 230. B stage epoxy adhesive 250 is applied to the active or bottom surface of the chip 200 either at the wafer level or chip level. An enlargement of a portion of FIG. 2A is shown in FIG. 2B. Vias 260 are formed in the substrate 240 and are plated with a conductor, such as gold (Au). The vias 260 are kept open.

As shown in FIG. 2C, as the flip chip 230 is being attached, the UBMs are aligned over the open vias 260 and the chip 200 is attached to substrate 240 through the adhesive 250 therebetween. Each of the conductive protrusions 220 are embedded within their respective vias 260. The bonding of the chip 200 to the substrate 240 can, for example, be achieved by thermo-compression.

Next, as shown in FIG. 2D, the chip 200 and the substrate 240 are encapsulated by mold resin 270. The encapsulation can, for example, be achieved by transfer molding. Then, as shown in FIG. 2E, a conductor 280 fills the vias 260. The filling of the vias 260 can be such that the conductor 280 fills the vias 260 until it protrudes outside of the vias 260 to form external package connections 290 in the form of solder balls 290a. In this particular embodiment, the conductor 280 is solder which is filled in the vias 260 by a ball drop or solder paste printing method. Alternatively, the external package connections 290 or solder balls, which protrude outside the vias, can be formed in a separate step after the vias 260 have been filled.

An alternate LGA package is shown in FIG. 2F, in which the external package connections 290 do not protrude out of the vias 260. The exposed end of the vias 260 form external package connections 290 in the form of a land grid array 290b FIGS. 3A to 3I illustrate a third embodiment of the inventive package and a method of making the package. FIG. 3A shows a semiconductor chip 300 with UBMs 310. The chip 300 and the UBMs 310 form a flip chip 330. B stage epoxy adhesive 350 is applied to the top of substrate 340. An enlargement of a portion of FIG. 3A is shown in FIG. 3B.

As shown in FIG. 3C, flip chip 330 is attached to the substrate 340 by, for example, thermo-compression.

Next, as shown in FIG. 3D, the chip 330 and the substrate 340 are encapsulated by mold resin 370. The encapsulation can, for example, be achieved by transfer molding.

Next, as shown in FIG. 3E, vias 360 are formed by laser drilling through the substrate 340. This results in the UBMs 310 of the flip chip 330 becoming exposed. Then, as shown in FIGS. 3F and 3G (FIG. 3G is an enlargement of a portion of FIG. 3F), vias 360 are plated with a conductor 365, such as gold (Au).

Then, as shown in FIG. 3H, the vias 360 are filled with a conductor 380. The filling of the vias 360 can be such that the conductor 380 fills the vias 360 until it protrudes outside of the vias 360 to form external package connections 390 in the form of solder balls 390a. In this particular embodiment, the conductor 380 is solder. The vias 360 can, for example, be filled by a ball drop or solder paste printing method. Alternatively, the external package connections 390 or solder balls 390a, can be formed in a separate step after the vias 360 have been filled.

An alternate LGA package is shown in FIG. 3I, in which in which the external package connections 390 do not protrude out of the vias 360. The exposed end of the vias 360 form external package connections 390 in the form of a land grid array 390b.

Figure 4B:
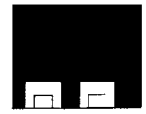

FIGS. 4A to 4H illustrate a fourth embodiment of the inventive package and a method of making the package. FIG. 4A shows a semiconductor chip 400 with UBMs 410. An enlargement of a portion of FIG. 4A is shown in FIG. 4B. The chip 400 and the UBMs 410 form a flip chip 430.

As shown in FIG. 4A, B stage epoxy adhesive 450 is applied to the top of substrate 440. The substrate 440 has unplated vias 460.

Figure 4C:

As shown in FIG. 4C, as the flip chip 430 is being attached, the UBMs are aligned over the open vias 460 and the chip 400 is attached to the substrate 440 through adhesive 450 therebetween. The bonding of the chip 400 to the substrate 440 can, for example, be achieved by thermo-compression.

Figure 4D:
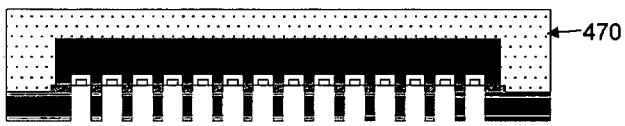
Figure 4E:
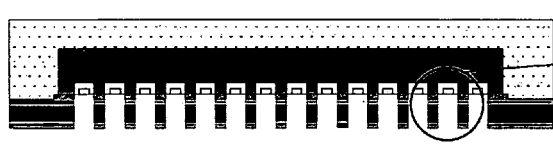
Figure 4F:
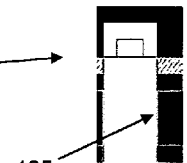

Next, as shown in FIG. 4D, the chip 400 and the substrate 440 are encapsulated by mold resin 470. The encapsulation can, for example, be achieved by transfer molding. Then, as shown in FIGS. 4E and 4F (FIG. 4F is an enlargement of a portion of FIG. 4E), vias 460 are plated with a conductor 465, such as gold (Au).

Figure 4G:
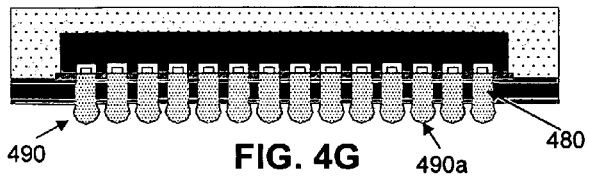

Then, as shown in FIG. 4G, a conductor 480 is filled in the vias 460. The filling of the vias 460 can be such that the conductor 480 fills the vias 460 until it protrudes outside of the vias 460 to form external package connections 490 in the form of solder balls 490a. In this particular embodiment, the conductor is solder. Ball drop or solder paste printing can be used to fill the vias 460 with conductor 480. Alternatively, the external package connections 490 or solder balls 490a, can be formed in a separate step after the vias 460 have been filled.

Figure 4H:
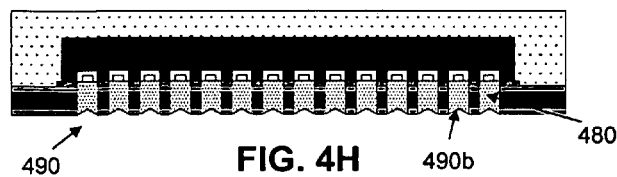
Figure 8:
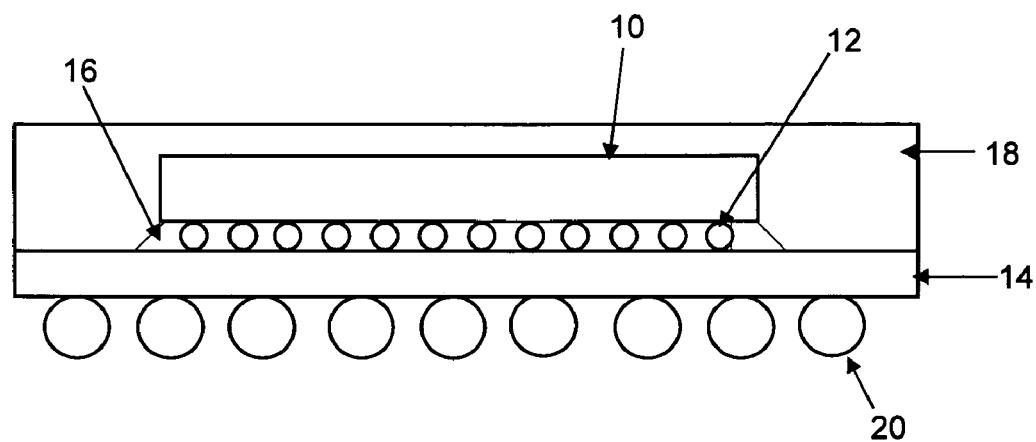
FIG. 8 illustrates an exemplary prior art semiconductor package.

An alternate LGA package is shown in FIG. 4H, in which the external package connections 490 do not protrude out of the vias 460. The exposed end of the vias 460 form external package connections 490 in the form of a land grid array 490b.

FIGS. 5A to 5H illustrate a fifth embodiment of the inventive package and a method of making the package. FIG. 5A shows a semiconductor chip 500 with UBMs 510. An enlargement of a portion of FIG. 5A is shown in FIG. 5B. The chip 500 and the UBMs form a flip chip 530.

FIG. 5A also shows a substrate 540 with unplated vias 560. The substrate 540 has a layer of solder mask (not shown) at its top surface.

As shown in FIG. 5C, as the flip chip 530 is being attached, the UBMs are aligned over the open vias 560 and the chip 500 is attached to the substrate 540 by thermo-compression. During thermo-compression process, the solder mask will soften and act as adhesive between chip 500 and substrate 540 interface.

Next, as shown in FIG. 5D, the chip 500 and the substrate 540 are encapsulated by mold resin 570. The encapsulation can, for example, be achieved by transfer molding. Then, as shown in FIGS. 5E and 5F (FIG. 5F is an enlargement of a portion of FIG. 5E), vias 560 are plated with a conductor 565, such as gold (Au).

Then, as shown in FIG. 5G, a conductor 580 is filled in the vias 560. The filling of the vias 560 can be such that the conductor 580 fills the vias 560 until it protrudes outside of the vias 560 to form external package connections 590 in the form of solder balls 590a. In this particular embodiment, the conductor is solder. Ball drop or solder paste printing can be used to fill the vias 560 with conductor 580. Alternatively, the external package connections 590 or solder balls 590a, can be formed in a separate step after the vias 560 have been filled.

An alternate LGA package is shown in FIG. 5H, in which the external package connections 590 do not protrude out of the vias 560. The exposed end of the vias 560 form external package connections 590 in the form of a land grid array 590b.

FIGS. 6A to 6H illustrate a sixth embodiment of the inventive package and a method of making the package. FIG. 6A shows a semiconductor chip 600 with UBMs 610. An enlargement of a portion of FIG. 6A is shown in FIG. 6B. The chip 600 and the UBMs 610 form a flip chip 630. A substrate 640 has unplated vias 660. In addition, B stage epoxy adhesive 650 is applied to the active surface or bottom of the flip chip 630 while leaving the UBMs 610 exposed.

As shown in FIG. 6C, as the flip chip 630 is being attached, the UBMs 610 are aligned over the open vias 660 and the flip chip 630 is attached to the substrate 640 by, for example, thermo-compression.

Next, as shown in FIG. 6D, the chip 600 and the substrate 640 are encapsulated by mold resin 670. The encapsulation can, for example, be achieved by transfer molding. Then, as shown in FIGS. 6E and 6F (FIG. 6F is an enlargement of a portion of FIG. 6E), vias 660 are plated with a conductor 665, such as gold (Au).

Then, as shown in FIG. 6G; a conductor 680 is filled in the vias 660. The filling of the vias 660 can be such that the conductor 680 fills the vias 660 until it protrudes outside of the vias 660 to form external package connections 690 in the form of solder balls 690a. In this particular embodiment, the conductor 680 is solder. Ball drop or solder paste printing can be used to fill the vias 660 with the conductor 680. Alternatively, the external package connections 690 or solder balls 690a, can be formed in a separate step after the vias 660 have been filled.

An alternate LGA package is shown in FIG. 6H, in which the external package connections 690 do not protrude out of the vias 660. The exposed end of the vias 660 form external package connections 690 in the form of a land grid array 690b.

FIGS. 7A to 7J illustrate a seventh embodiment of the inventive package and a method of making the package. FIG. 7A shows a semiconductor chip 700 with UBMs 710. In this particular embodiment, conductive protrusions, such as stud bumps 720, protrude below the UBMs. In this particular embodiment, the stud bump 720 is comprised of gold. An enlargement of a portion of FIG. 7A is shown in FIG. 7B. The chip 700, the UBMs 710 and the stud bumps 720 form a flip chip 730.

FIG. 7A also shows a substrate 740 with vias 760 plated with a conductor 765. In this particular embodiment the conductor 765 is gold.

As shown in FIG. 7C, as the flip chip 730 is being attached, the UBMs 710 are aligned over the open vias 760 and the chip 700 is attached to the substrate 740 through the adhesive 750 therebetween. Each of the conductive protrusions or stud bumps 720 are partially within their respective open vias 760. An inter-metallic (not shown) may be provided at the interface 766 of the stud bumps 720 and the plated walls of the vias 760 to improve electrical contact at the interface as shown in FIG. 7D.

As shown in FIG. 7E, space between the chip 700 and the substrate 740 is filled with an underfill resin 775. The underfill resin can be dispensed into the space to encapsulate the gold stud bumps 720.

Next, as shown in FIG. 7F, the chip 700, the substrate 740 and the underfill resin 775 are encapsulated by mold resin 770. The encapsulation can, for example, be achieved by transfer molding.

Then, as shown in FIGS. 7G and 7H, the vias 760 are filled with an electrically conductive epoxy 795. An enlargement of a portion of FIG. 7G is shown in FIG. 7H.

As shown in FIG. 7I, a conductor 780 is filled in the vias 760. The filling of the vias 760 can be such that the conductor 780 fills the vias 760 until it protrudes outside of the vias 760 to form external package connections 790 in the form of solder balls 790a. In this particular embodiment, the conductor 780 is solder. Ball drop or solder paste printing can be used to fill the vias 760 with the conductor 780. Alternatively, the external package connections 790 or solder balls 790a, can be formed in a separate step after the vias 760 have been filled.

An alternate LGA package is shown in FIG. 7J, in which the external package connections 790 do not protrude out of the vias 760. The exposed end of the vias 760 form external package connections 790 in the form of a land grid array 790b.

It will be appreciated that the methods and apparatuses described above can advantageously result in a direct electrical connection between the UBMs (for non-bumped chips) or conductive protrusions (for chips with solder bumps, Cu pillars with solder cap or metallic stud bumps) and the external package connections. The direct electrical connection comprises the filled vias and the external package connections, both of which may be formed in a single step of filling of the vias with the conductor. As the UBMs or conductive protrusions, the filled vias and the external package connections are connected in a single connection, reliability of such an interconnect can be improved. Another advantage of forming the electrical connection in this manner is that stress on the UBMs or conductive protrusions of the flip chip, and on the external package connection, may be reduced. Furthermore, in the methods described, as the conductive protrusions of the flip chip are embedded partially or entirely within the vias in the substrate, there is no need to carry out an underfilling step to protect the conductive protrusions with an underfill resin.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
a semiconductor chip having under bump metallizations (UBMs) on a first surface;
a substrate having open vias, the substrate being attached to the semiconductor chip and the UBMs being in alignment with the open vias;
an encapsulant surrounding the semiconductor chip and the substrate; and
conductors, in direct contact with the UBMs, which fill the open vias to form external package connections;
wherein the conductors protrude outside the open vias to form external package connections in the form of conductive bumps.

2. The semiconductor package of claim 1, further comprising an adhesive between the first surface of the chip and the substrate.

3. A semiconductor package comprising:
a semiconductor chip having under bump metallizations (UBMs) on a first surface;
conductive protrusions extending below the UBMs;
a substrate having open vias, the substrate being attached to the semiconductor chip and the UBMs being in alignment with the open vias;
an encapsulant surrounding the semiconductor chip and the substrate; and
conductors, in direct contact with the conductive protrusions, which fill the open vias to form external package connections;
wherein the conductive protrusions extend into the open vias,
wherein the conductors protrude outside the open vias to form external package connections in the form of conductive bumps.

4. The semiconductor package of claim 3, wherein the conductive protrusions are solder bumps.

5. The semiconductor package of claim 3, wherein the conductive protrusions are metallic pillars with a solder cap.

6. The semiconductor package of claim 3, wherein the conductive protrusions are metallic stud bumps.

7. The semiconductor package of claim 1, wherein walls of the open vias are plated with a conductive metallic material.

8. The semiconductor package of claim 7, wherein the conductive metallic material is gold.

9. The semiconductor package of claim 3, further comprising an adhesive between the first surface of the chip and the substrate.

10. The semiconductor package of claim 3, wherein walls of the open vias are plated with a conductive metallic material.

11. The semiconductor package of claim 10, wherein the conductive metallic material is gold.

12. A semiconductor package comprising:
a semiconductor chip having under bump metallizations (UBMs) on a first surface;
conductive protrusions extending below the UBMs;
conductive materials extending below the conductive protrusions;
a substrate having open vias, the substrate being attached to the semiconductor chip and the UBMs being in alignment with the open vias;
an encapsulant surrounding the semiconductor chip and the substrate; and
conductors, in direct contact with the conductive materials, which fill the open vias to form external package connections;
wherein the conductive protrusions and conductive materials extend into the open vias.

13. The semiconductor package of claim 12, wherein the conductors protrude outside the open vias to form external package connections in the form of conductive bumps.

14. The semiconductor package of claim 12, further comprising an adhesive between the first surface of the chip and the substrate.

15. The semiconductor package of claim 12, wherein the conductive protrusions are metallic stud bumps.

16. The semiconductor package of claim 12, wherein walls of the open vias are plated with a conductive metallic material.

17. The semiconductor package of claim 16, wherein the conductive metallic material is gold.

18. The semiconductor package of claim 12, wherein an underfill material encapsulates the conductive protrusions.

19. The semiconductor package of claim 3, wherein the conductors that fill the opens vias are solder.

* * * * *